United States Patent [19]

Nozuyama et al.

[11] Patent Number: 5,821,786
[45] Date of Patent: Oct. 13, 1998

[54] SEMICONDUCTOR INTEGRATED CIRCUIT HAVING FUNCTION FOR EVALUATING AC PERFORMANCE

[75] Inventors: Yasuyuki Nozuyama, Tokyo; Misao Miyata, Kanagawa, both of Japan

[73] Assignee: Kabushiki Kaisha Toshiba, Kanagawa, Japan

[21] Appl. No.: 827,067

[22] Filed: Mar. 26, 1997

Related U.S. Application Data

[63] Continuation of Ser. No. 283,195, Aug. 4, 1994, abandoned.

[30] Foreign Application Priority Data

Aug. 3, 1993 [JP] Japan .................................. 5-194506

[51] Int. Cl.$^6$ ...................................................... H03K 3/353
[52] U.S. Cl. ............................ 327/141; 327/437; 327/23; 327/24; 327/41; 327/262
[58] Field of Search ............................ 327/437, 58, 272, 327/403, 576, 22, 23, 24, 41, 141, 310, 407, 261, 291, 292, 295, 262; 326/86, 82, 83

[56] References Cited

U.S. PATENT DOCUMENTS 4,785,204  11/1988  Terada et al. ............................ 327/141
5,321,354   6/1994  Ooshima et al. ..................... 324/158 R

*Primary Examiner*—Timothy P. Callahan
*Assistant Examiner*—Dinh Le
*Attorney, Agent, or Firm*—Finnegan, Henderson, Farabow, Garrett & Dunner, L.L.P.

[57] ABSTRACT

A semiconductor integrated circuit, having circuit blocks to be evaluated in AC performance, includes a first circuit for inputting a first signal and a second signal generated in the interior of the semiconductor integrated circuit. The first circuit outputs a transient current when the first signal and the second signal change simultaneously. In the semiconductor integrated circuit, the transient current (third signal) is output to a external terminal of the semiconductor integrated circuit for evaluating the AC performance of the block.

17 Claims, 8 Drawing Sheets

SEMICONDUCTOR INTEGRATED CIRCUIT HAVING FUNCTION FOR EVALUATING AC PERFORMANCE This is a continuation of application Ser. No. 08/283,195, filed Aug. 4, 1994 and now abandoned.

BACKGROUND OF THE INVENTION

1. Field of the Invention

The present invention relates to a semiconductor integrated circuit having a function based on test technology for LSIs such as logical VLSIs and the like, and, in particular, to a semiconductor integrated circuit including a simple circuit which detects a transient current or a voltage change only when two signals are changed simultaneously in a series of MOS elements in the simple circuit, in which the transient current or the voltage change is observed so that, as a result, rising or falling edges of clock signals which are directly supplied to input and output registers respectively of the circuit blocks being evaluated for AC performance can be accurately detected to be in coincidence, and, also, the phase difference between the block signals can be output externally without modification from the inside of the LSI, and by adjusting the phase difference of the related external clock signals, it is possible to accurately evaluate the phase difference of the external clock signals and the phase difference of the internal clock signals.

2. Description of the Prior Art

Conventionally, the output of a circuit block inside an LSI is observed at a timing which is differ from a rising edge or falling edge of a system clock signal of the LSI, or the output of the circuit block in the LSI is observed by inputting an input signal to the circuit block in order to evaluate detailed AC operation performance such as access time or to analyze the lowest performance of the circuit block. In recent years these requirements are becoming more urgent as a result of the appearance of ASICs (Application Specific ICs) in which VLSIs and LSIs are integrated, and the striking improvement in their operational speed.

Conventionally, known methods of carrying out evaluation and analysis of AC operation performance of a circuit block in an LSI include the following methods (1) to (3).

(1) A connection method wherein the inputs or outputs of the object circuit block are connected directly to external terminals (hereinafter referred to as pins) of an LSI chip.

(2) A method wherein a register, which can store the results of evaluation of a circuit block, i.e., the output register of the circuit, or a flip-flop (hereinafter, F/F) is activated by an external test clock signal which differs from the system clock signal; the corresponding timing between these clock signals is changed, and an observation is made as to whether or not the test results can be correctly stored in the register or the F/F.

(3) A method wherein the signal from an real chip is evaluated directly, using an electron beam tester (EBT).

First, the method (1) is used in the case where it is desired to directly test, for example, an internal memory circuit block in an LSI. FIG. 1 is a block diagram showing this method (first conventional example). Test data to a circuit block 102, which is to be evaluated, is supplied from input pins 111 for an LSI chip 100 via a multiplexer 103. In addition, the output of the circuit block 102 being evaluated corresponding to this input data is output externally from output pins 112 of the LSI chip 100 via a multiplexer 104.

For simplicity, a description of the connection to the LSI chip 100 of a normal-operation logic section 105 for Normal Operation used for normal-operation, other than the circuit block 102 being evaluated, has been omitted.

Other input to the multiplexers 103 and 104 is the output from the logic section 105 used for normal operation. In FIG. 1, the output of the circuit block 102 being evaluated is multiplexed with the output of the normal-operation logic section 105 by the multiplexer 104 and is output to an external device through the external output terminals (Pins).

If the number of available of pins for the LSI chip 100 is more than that for normal operation, the output from the evaluation objected circuit block 102 can also be directly connected to the surplus output pins 112 of the LSI chip 100. However, the number of pins is usually limited therefore this use is severely restricted, so that the configuration utilizes a multiplexer, as shown in FIG. 1.

When the circuit block 102 to be evaluated is tested, a test mode signal TMD, which is a signal for selecting the multiplexers 103, and 104, is kept to "1". After the multiplexers 103, 104 select the data path for the test of the circuit block 102 to be evaluated, external test input data is applied, and, after a predetermined time interval, the test result output data from the circuit block 102 to be evaluated is read out to an external destination, and the test result output data is compared with a expected value.

However, in the method using the multiplexers 103 and 104, the output of the circuit block 102 to be evaluated is always observed externally only, with the purpose of directly testing the circuit block 102 externally. For this reason, it is possible to evaluate an approximate value of the AC operation performance of the circuit block 102, but by this connection method (1) it is difficult to accurately evaluate the true value. It is therefore clear that it will probably be necessary to provide more accuracy in the near future.

In actual practice, it is difficult to decide the arrangement of basic cells and wiring path for the basic cells such as the multiplexer or the like so that it adjust a special signal delay to a certain target value by using existing automatic layout tools used mainly for ASIC and the like. Basically, it is only possible to suppress a maximum delay (or wiring length) within an allowable range. Then, finally, it is extremely difficult to control in advance the kind of layout and the amount of signal delay in the data path which is used in the test of the circuit block 102 to be evaluated, using existing layout tools.

At any rate, in general, the estimation of the AC operation performance by the method (1), load capacitance and the like being obtained with good precision from the LSI after layout, is performed by circuit simulation, but if the LSI is large-scaled, the CPU time increases, and in addition, precision of simulation is degraded. Moreover, there is a problem that the preparation of basic data ($V_{DD}$–$I_{DD}$ characteristics for transistors, and the like) used for highly precise simulation under various measurement conditions is extremely difficult.

As outlined above, an approximate evaluation of the AC operation performance of an internal circuit block is possible with this method. It can also be utilized in selecting load tests in which the measurement conditions are determined, but because the evaluation of an accurate AC operation performance is difficult, this method will not be touched upon further.

Next, method (2) will be explained with reference to FIG. 2 (second conventional embodiment). A circuit block 2 for which the AC operation performance is to be evaluated is formed in an LSI chip 101. Data input to the circuit block 2 is supplied from an input register 3. The output of the circuit block 2 corresponding to this input data is taken into an output register 4. FIG. 2 shows the LSI chip 101 divided into a normal operation mode for carrying out primary operations and a test operation mode for implementing an AC operation performance evaluation for the circuit block 2 by means of the respective test mode signal TMD values "0" and "1".

In the normal operation mode (TMD="0"), a system clock signal SCLK which is supplied externally to the LSI chip 101 through a pin 5 is first driven by a buffer 9 with high driving force for driving a main clock line L1 (in the drawing the wiring L1 extending downward from the output of the buffer 9), after which it is driven by a buffer 10 for driving a small clock branch line L2, and is supplied as a clock signal to the input register 3. Also, in the output register 4, the system clock signal SCLK is first driven by the buffer 9, then is input to a buffer 11 for driving the clock branch line L3 through a multiplexer 8 for clock switching. Then, the system clock signal SCLK is driven by the buffer 11 for driving the clock branch line L3 and is supplied to the output register 4 as a clock signal.

In the test operation mode (TMD="1"), a clock signal supplied to the output register 4 is changed. Specifically, because the multiplexer 8 selects a test clock signal TCLK as input, this signal is driven by the buffer 11 for driving the clock branch line and is supplied to the output register 4 as a clock signal. Specifically, in the clock signal input to the output register 4, there is the possibility that a clock skew might be produced between the input register 3 and the output register 4 because an extra delay is input from the multiplexer 8.

To keep the clock skew within allowable limits, the adjustment of the number of stages of buffers and the number of buffers must be considered in the design. In addition, there are cases in which the configuration of clock branches is completely different from that shown in FIG. 2. However, these have no bearing on the true nature of the later-described present invention.

In the evaluation of the AC operation performance of the circuit block 2 between the input register 3 and the output register 4, the phase difference between the system clock signal SCLK applied to the register 3 through the input pin 5 from an external source and the test clock signal TCLK applied to the register 4 at the same frequency is controlled in the test operation mode.

By decreasing the time interval between the timing at which new test data is input to the register 3 and the timing at which the output of the circuit block 2 for the test data is input to the register 4, suitable tests can be executed. As a result, the above-mentioned time interval when the value which is to be stored in the output register 4 during normal operation is not stored is called as the AC operation performance of the circuit block 2, or the maximum operation frequency (fmax). There is no problem with the write-in of the test input data to the input register 3 and the read-out of the value stored in the output register 4 if it is possible to directly interface external to the LSI. However, when this is not the case, a configuration is provided so that it is possible to scan the output register 4, and the output of the test results is normally carried out well in scan operation mode although the overhead of a circuit is small (but since this bears no relation to the true nature of the later-described present invention, a detailed explanation will be omitted here).

The above technique can be applied to a configuration as the easiest way of implementation in which the system clock signal SCLK or the test clock signal TCLK is not multiplexed (as shown in FIG. 2) but only the output in the branch line of the system clock signal SCLK is supplied directly to the output register 4. In this case, the AC operation performance is evaluated by simply increasing the frequency of the system clock signal SCLK, using this structure, as described above, corresponding only to normal operation mode. There are cases where this works very well. However, usually there exists a logic part in an LSI, which becomes a critical path (speed limitation path or maximum delay path) which determines the maximum operation frequency fmax in a LSI. If the maximum operating frequency fmax of the circuit block (the AC operation performance of which is evaluated) is not corresponding to the critical path, prior to the detection of a desired maximum operating frequency fmax, a logic part including the critical path produces an error. In most cases when this happens, the LSI chip does not even perform normal operation and becomes unable to evaluate the AC operational performance of the circuit block being evaluated. However, there are cases wherein it is possible to supply a system clock signal from the LSI tester so that the cycle of one optional clock cycle only is shortened during normal operation, and the cycle (frequency) of all other cycles which can operate normally is maintained. At this time it is possible to determine the AC operation performance of the circuit block which is the object, one clock cycle at a time. However, for the evaluation of the fmax of a circuit block for which a large amount of test data is normally required, the efficiency of this method is extremely poor.

A more serious problem is that, with a popular type of LSI tester, for the upper limit of the clock frequency which can be generated, there are cases where it can be said that it is not adequate in the viewpoint of the evaluation of the AC operation performance of recent high speed internal circuit blocks for LSIs.

As a result, in carrying out the method (2), for an external system clock signal SCLK, the use of an independently controllable test clock signal TCLK is considered to be the most appropriate. This type is generally the most popular in actual practice. Also, if the object is only to evaluate the AC operation performance of the circuit block 2, it is not necessarily required that the output register 4 for normal operations be used as the register for storing test results. There are cases where a test result storage register is provided which is operated only by the test clock signal TCLK. In such a case the clock signal for the output register 4 can be exactly the same as that for the input register 3 so that it is easy to design the clock system for normal operation.

Also, in the case where many circuit blocks can output to a common bus, as with a microprocessor or the like, a test result storage register is also provided for that bus. In this case also, an externally controllable test clock signal TCLK for this register can be in a direct supply format, and the format by which the system clock signal SCLK is supplied directly to the register for normal operation is also possible.

In the later-described present invention, because any of these can be applied in spite of the above differences, a detailed explanation has been given only for the case shown in FIG. 2 as an example of the method (2).

With the above-described method (2), conventionally, based on supposition that there is not such a great difference between the phase difference between the system clock signal SCLK applied from an external source and the test clock signal TCLK, and the phase difference between these signals in the LSI chip, it has not been tried to accurately measure these phase differences. For example, even when this is carried out, only an estimation is made from a calculated value obtained by performing a circuit simulation under limited conditions in which circuit data is extracted from circuit layout. However, the above difference, as touched upon in the explanation of the method (1), is greatly influenced by the internal layout and the logic gate for the buffer used, and the like.

Actually, for circuit blocks in a recent high speed LSI, a highly accurate evaluation of the AC operation performance cannot be realized without accurately calculating the above-described differences in the phase differences using a special technique as described later for an embodiment of the present invention.

Specifically, even with the method (2), a means is lacking for accurately evaluating the timing relationship between the system clock signal SCLK and the test clock signal TCLK, input from an external source, and these clock signals at the vicinity of the circuit block 2 which is the internal object, therefore, in the same manner as for the method (1), there is the serious problem that it will be difficult to provide the precision required for AC operation performance evaluation in the near future.

In the conventional method (3), because it is possible to directly observe the desired signal, there is no problem with discrepancy between the actual chip data and the simulated data. Therefore this is the most reliable method for calibrating the timing. However, the popularization of the EBT device has generally been delayed because of its high price, and there is a drawback that if a signal node is not exposed, there is deterioration in the S/N ratio of the signals. Also the LSI which is to be evaluated must be placed under vacuum condition. Therefore time is required to set the LSI chip, and heating and cooling is not easy. Furthermore measurements are taken differently from a usual LSI tester. Accordingly, the through-put is also reduced and it is not practical at all to obtain with high reliability the AC operational performance of a circuit block of a LSI by evaluating many chips of the LSI and performing statistical processing of evaluated data.

As outlined in the foregoing, with a conventional semiconductor integrated circuit, when AC operation performance is evaluated correctly for circuit blocks within an LSI using two types of clock signals for which the phase difference can be controlled externally, there is the problem that it is difficult to perform accurate AC operation performance evaluation for circuit blocks inside LSIs because there is no method for evaluating at circuit level which can accurately evaluate the phase differences for external clock signals and internal phase differences.

SUMMARY OF THE INVENTION

Accordingly, an object of the present invention is, with due consideration to the drawbacks of such conventional devices, to provide a semiconductor integrated circuit wherein the technology used for evaluating the AC operation performance of an internal circuit block for an LSI or the like with high precision utilizes a series connector of MOS elements and a simple circuit means wherein an transient current flows or the voltage is changed only when two signal are changed simultaneously, and this current or voltage is observed so that, as a result, rising or falling edges of clock signals which are directly supplied to input and output registers respectively of the circuit blocks being evaluated for AC performance can be accurately detected to be in coincidence, and, also, the phase difference between the block signals can be output externally without modification from inside of the LSI, and by adjusting the phase difference of the related external clock signals, it is possible to accurately evaluate the phase difference of the external clock signals and the phase difference of the internal clock signals.

A semiconductor integrated circuit as a preferred embodiment of the present invention, comprises:
first circuit means for inputting a first signal and a second signal generated in the interior of the semiconductor integrated circuit, for outputting transient current as a third signal when the first signal and the second signal change simultaneously,
wherein
the third signal is output to a external terminal of the semiconductor integrated circuit,
In the semiconductor integrated circuit above, the first circuit means comprises a series circuit including two PMOS transistors and two NMOS transistors connected in series, wherein
the source of one of the NMOS transistors corresponding to one end of the series circuit is grounded,
the source of one of the PMOS transistors corresponding to the other end of the series circuit is connected to the external terminal of the semiconductor integrated circuit,
the first signal is input to the gate of one of the PMOS transistors and to the gate of one of the NMOS transistors; and
the second signal is input to the gate of the other PMOS transistor and to the gate of the other NMOS transistor.

In the semiconductor integrated circuit described above, in the first circuit means, the source of one of the NMOS transistors connected in series is connected to the external terminal of the semiconductor integrated circuit, the source of one of the PMOS transistors is connected to a power source.

In the semiconductor integrated circuit described above, the first circuit means includes a circuit element which functions as a resistance, and one end of the circuit element is connected to the power source or the external terminal of the semiconductor integrated circuit;
the external terminal is connected to the source of a third PMOS transistor of which the drain is grounded;
the other end of the circuit element is connected to the end of the series circuit which is the source of the PMOS transistor, and to the gate of the third PMOS transistor;
the first signal is input to the gate of either one of the PMOS transistors and the gate of either one of the NMOS transistors of the series circuit; and
the second signal is input to the gate of the other PMOS transistor and the gate of the other NMOS transistor of the series circuit.

In the semiconductor integrated circuit described above, in the first circuit means, the external terminal of the semiconductor integrated circuit is connected only to the drain of the third PMOS transistor, and the source of the third PMOS transistor is connected to the power source.

In the semiconductor integrated circuit described above the first circuit means includes a circuit element which functions as a resistance, and one end of the circuit element is grounded;
the external terminal of the semiconductor integrated circuit is connected to the drain of the third NMOS transistor of which the source is grounded;
the other end of the circuit element is connected to the end of the series circuit which is the source of the NMOS transistor, and to the gate of the third NMOS transistor;
the another end of the series circuit which is the source of the PMOS transistor is connected to the external terminal or the power source;

the first signal is input to the gate of one of the PMOS transistors and the gate of one of the NMOS transistors of the series circuit; and the second signal is input to the gate of the other PMOS transistor and the gate of the other NMOS transistor of the series circuit.

In the semiconductor integrated circuit described above, in the first circuit means, the external terminal of the semiconductor integrated circuit is connected to the source of the third NMOS transistor or to the circuit element; and the drain of the third NMOS transistor, and the end of the series circuit which is the source of the PMOS transistor is connected to the power source.

A semiconductor integrated circuit as another preferred embodiment of the present invention, comprises:

second circuit means for inputting a first signal and a second signal generated in the interior of the semiconductor integrated circuit and for outputting a third signal to a external terminal of the semiconductor integrated circuit, wherein the second circuit means change a voltage of a third signal when the two signals change simultaneously.

In the semiconductor integrated circuit described above, the second circuit means comprises a series circuit in which two PMOS transistors and two NMOS transistors are connected in series, and one PMOS transistor of which the gate is grounded connected in series, the end of the series circuit which is the source of the NMOS transistor is grounded;

the source of one of the PMOS transistors of which the gate is grounded is connected to the power source;

the external terminal of the semiconductor integrated circuit is connected to the point connecting the drain of the PMOS transistor, of which the gate is grounded, to the end of the series circuit which is the source of the PMOS transistor;

the first signal is input to the gate of one PMOS transistor and to the gate of one NMOS transistor of the series circuit; and the second signal is input to the gate of the other PMOS transistor and to the gate of the other NMOS transistor of the series circuit.

In the semiconductor integrated circuit described above, the second circuit means comprises the series circuit and a NMOS transistor, of which the gate is grounded, connected in series, the source of the NMOS transistor of which the gate is connected to the power source, is grounded, the end of the series circuit which is the source of the PMOS transistor is connected to the power source;

the external terminal of the semiconductor integrated circuit is connected to the point connecting the drain of the NMOS transistor, of which the gate is connected to the power source, to the end of the series circuit which is the source of the NMOS transistor;

the first signal is input to the gate of one PMOS transistor and to the gate of one NMOS transistor of the series circuit; and the second signal is input to the gate of the other PMOS transistor and to the gate of the other NMOS transistor of the series circuit.

A semiconductor integrated circuit as another embodiment of the present invention, comprises:

a plurality of the first circuit means described above or the second circuit means described above, wherein the third signals of the first circuit means and the third signals of the second circuit means are not directly connected to the external terminal of the semiconductor integrated circuit; and selection means for inputting the third signals of the first circuit means or the third signals of the second circuit means and for selecting one of these signals and for outputting it to the external terminal of the semiconductor integrated circuit.

In the semiconductor integrated circuit described above, circuit elements located in a first path from a sampling point of the first signal, and circuit elements located in a second path from a sampling point of the second signal, to respective input point of the first circuit means or the second circuit means are the same.

In the semiconductor integrated circuit described above, the circuit elements located in the first path and the second path comprise:

first and second sampling means for sampling the first signal and the second signal, respectively; and first and second wirings from the first and second sampling means to the input points of the first or the second circuit means, wherein the first and second sampling means have the same signal drivability; and the first and second wiring have the same load capacitance and resistance values.

A semiconductor integrated circuit as another preferred embodiment, comprises:

third circuit means for inputting a first signal and a second signal generated in the semiconductor integrated circuit, for outputting the first signal and the second signal via a first data path and a second data path, respectively which have an equal data propagation delay characteristic.

A semiconductor integrated circuit as another preferred embodiment of the present invention, comprises a plurality of groups of the third circuit means, each for inputting a first signal and a second signal generated in the semiconductor integrated circuit, for outputting the first signal and the second signal via a first data path and a second data path, respectively which have a equal data propagation delay characteristic; and selecting means for selecting a pair of the first signal and the second signal from one of the plurality of the third circuit means.

In the semiconductor integrated circuit described above each of the third circuit means comprises:

first and second sampling means for sampling the first signal and the second signal, respectively;

first and a second drive means for driving the output of the first and second sampling means; and third and fourth wirings from the first and second drive means to an external terminal of the semiconductor integrated circuit or the selection means, respectively, wherein the first and second sampling means and the first and second drive means have the same drivability, and the third and fourth wirings have the same load capacitance and resistance values.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

In the "BACKGROUND OF THE INVENTION" section, as indicated many times as problem areas in conventional technology, the evaluation of the AC operation performance of a circuit block 2 which is to be evaluated cannot be accurately performed because the phase difference between the system clock signal SCLK which is directly supplied to an input register 3 and a test clock signal TCLK which is supplied directly to an output register 4 cannot be accurately observed from outside an LSI chip 1. With the semiconductor integrated circuit of the present invention these problem areas are overcome by a simple circuitry method.

Figure 2:
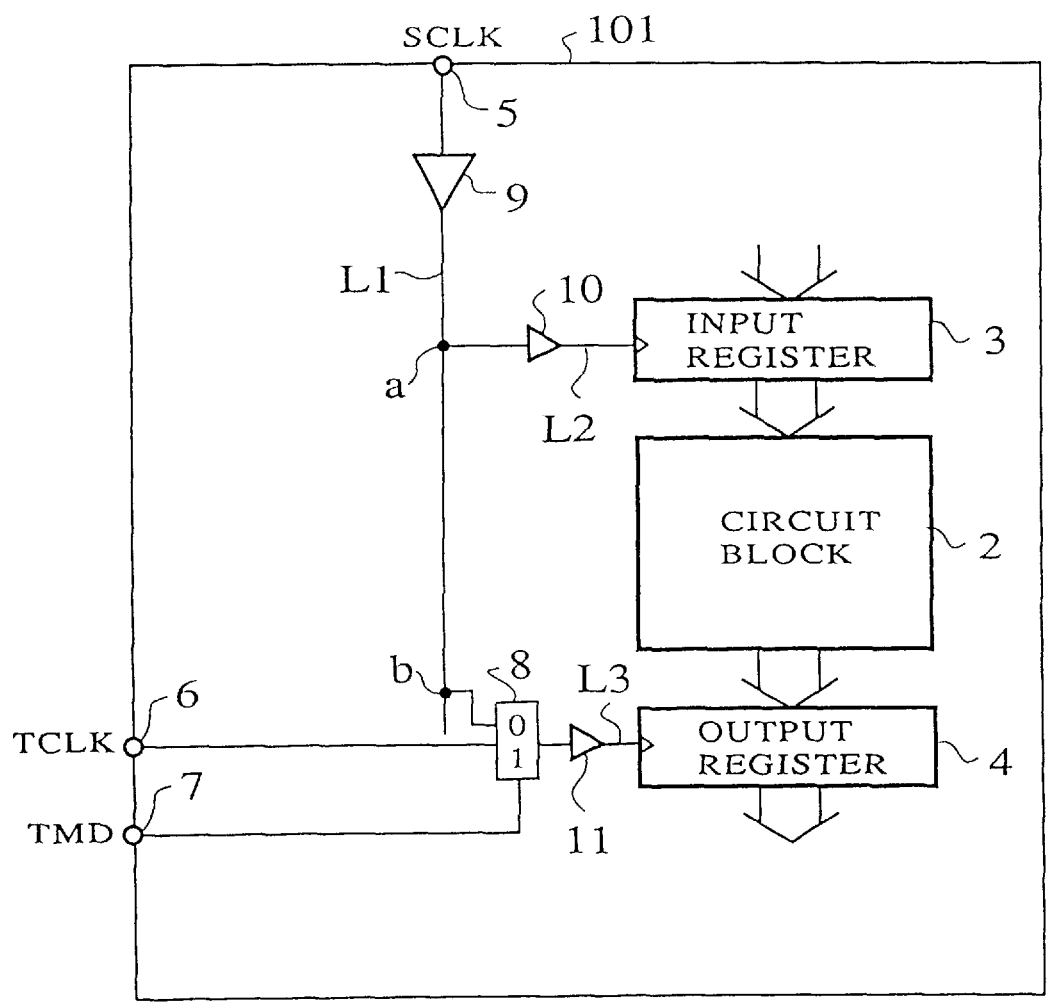
FIG. 2 is a circuit configuration diagram for a second conventional example (method wherein data is latched in synchronism with an external test clock signal which differs from the system clock signal) of a semiconductor integrated circuit.
Figure 3:
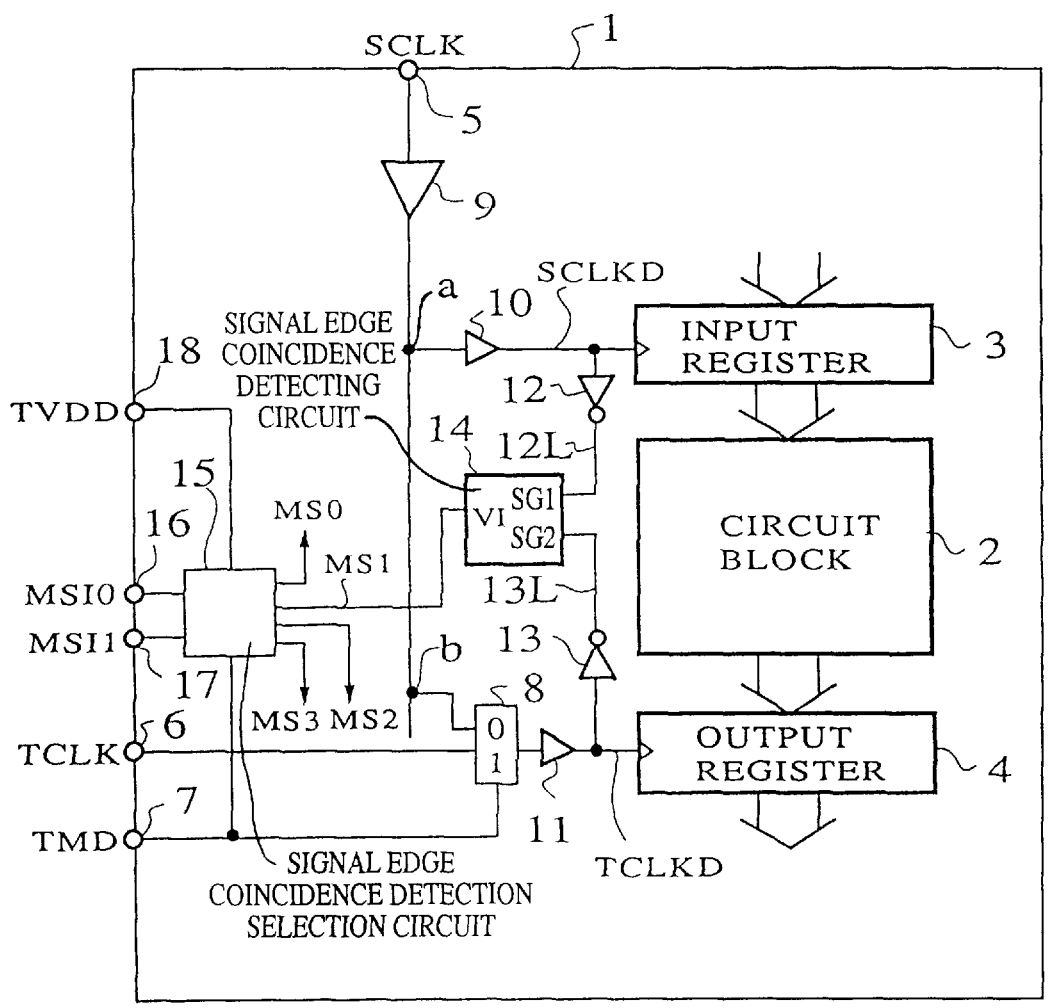
FIG. 3 is a circuit configuration diagram for a first embodiment (calibration by method wherein coincidence of rising or falling edges of signals is detected by observation of transient current or transient voltage) of a semiconductor integrated circuit of the present invention.

As a result, it is possible to evaluate the AC operation performance of the circuit block 2 with high precision. FIG. 3 is a circuit configuration diagram for a first embodiment of a semiconductor integrated circuit of the present invention. In this drawing, the same reference numerals designate parts which are duplicated within the second conventional example (FIG. 2), so the explanation will not be repeated. In addition, the explanation will center around parts which differ from the second conventional example shown in FIG. 2.

First, in order to accurately evaluate the AC operation performance of the circuit block 2 to be evaluated it is desired to calibrate two signals, specifically, an internal system clock signal SCLKD, which is supplied directly to the input register 3, and an internal test clock signal TCLKD, which is supplied directly to the output register 4 under conditions where a test mode signal TMD="1". These signals are supplied as a system clock signal SCLK and a test clock signal TCLK through the respective pins 5 and 6 from outside the LSI chip 1. With the semiconductor integrated circuit of this first embodiment, the object is to provide an accurate AC operation performance evaluation of the circuit block 2 by taking the phase differences of the system clock signal SCLK and the test clock signal TCLK when the edges of the internal system clock signal SCLKD and the internal test clock signal TCLKD for updating corresponding registers are detected to be precisely in coincidence as standard, and converting the phase difference of the internal system clock signal SCLKD and the internal test clock signal TCLKD with high precision to the phase difference of the externally supplied system clock signal SCLK and the test clock signal TCLK.

The special circuits and circuit elements included in the semiconductor integrated circuit as the first embodiment of the present invention are sampling circuits (a first and second sampling means 12 and 13) to which the internal system clock SCLKD and the internal test clock signal TCLKD to be calibrated are provided for sampling; signal edge coincidence detection circuits (first or second circuit means 14, 14a, 14b, 14c, 14d, 14e, or 14f); wiring between these circuits (first and second wiring 12L and 13L); and selection circuits (selection means 15) for detecting signal edge coincidence for selecting circuit blocks to be evaluated (or neighboring clock signals whose coincidence in edges to be detected).

These will now be explained in order.

First, the internal clock signals to be calibrated (the internal system clock signal SCLKD and the internal test clock signal TCLKD) are sampled through inverters 12 and 13 (the first and second sampling means) respectively and are input to input terminals SG1 and SG2 of the signal edge coincidence detecting circuit 14 for detecting rising or falling edges of signals in coincidence, via the first and second wiring 12L and 13L. In order to eliminate the influence of the inverters 12 and 13 on the clock signal during normal operation, the smallest inverters as possible in size should be used. (There are also other reasons which will subsequently be explained). Also, in order to guarantee that the two signals which are sampled are input at exactly the same delay to the circuit 14 for detecting signals in coincidence, for example, in a case that wires for signal paths are made of metal, it is necessary that the gate widths of the inverters 12 and 13 (even stricter layout shape) be the same, and the lengths of the wiring 12L and 13L be the same. In relation to the wiring lengths, for example, if the signal edge coincidence detection circuit 14 is positioned at a location equidistant from the sampling points for the above-mentioned two signals, the above conditions are easily satisfied.

Next, in the signal edge coincidence detection circuit 14, when the signals input to the terminals SG1 and SG2 are changed simultaneously, it is possible to detect the coincidence of the edges of these signals from the fact that current is caused to flow through the terminal VI (detailed explanation later). For this reason, both the timing wherein the two signals are changed from "1" to "0" and the timing wherein the two signals are changed from "0" to "1" can be detected and calibrated.

In addition, calibration is possible by detecting coincidence in the timing where the two signals are mutually changed in the reverse direction. Further, to maximize the effect of the present invention whereby the coincidence of the edges of two signals is detected and calibrated by means of transient current, in the signal edge coincidence detection circuit 14 of the scale provided, it is desirable that the two clock signals be in coincidence, for example, at all edges (timing at which the logic value is changed).

For this reason, in the case where it is desired to calibrate by timing whereby the two signals are changed in the same direction, the duty ratios of the two signals (ratio of the high state time interval to the low state time interval) are the same. On the other hand, in the case where it is desired to calibrate by timing whereby the two signals are changed in the opposite direction, the duty ratios of the two signals are reversed and then may be supplied to the signal edge coincidence detection circuit.

The signal edge coincidence detection selection circuit 15 is for selecting a circuit block for AC operation performance evaluation (calibration by detection of edge coincidence of adjacent block signals). In FIG. 3, the decode input is two bits (MSI0 and MSI1), and up to four circuit blocks can be selected for AC operation performance evaluation.

Figure 4:
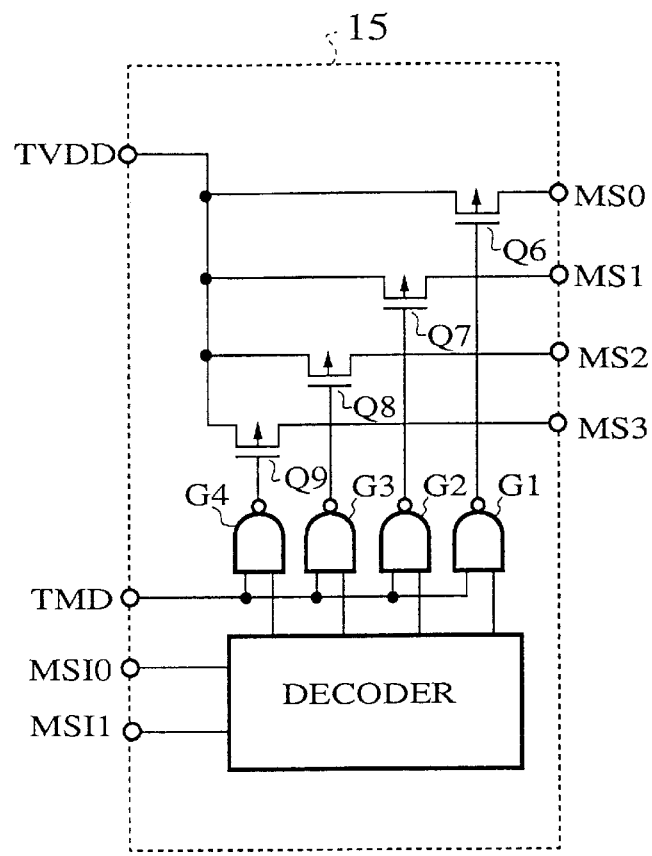
FIG. 4 is a circuit configuration diagram for a signal edge coincidence detection selection circuit of the first embodiment of the present invention shown in FIG. 3.

FIG. 4 shows the configuration of the signal edge coincidence detection selection circuit 15. The decode input signals MSI0 and MSI1, input from outside the LSI chip 1 via the input pins 16 and 17, are input to a two-bit decoder DEC. The decoder DEC is positive logic (high active), and the selected output only takes the form "1" while the other output takes the form "0".

These outputs are connected to one input of two-input NAND gates G1 to G4. An external test operating mode signal line TMD is connected to the other input of the two-input NAND gates G1 to G4.

A potential (normally, a potential VDD supplied to the power source of the LSI chip 1) higher than the ground potential (GND) is provided to a terminal TVDD for supplying an external current from an external current supply source (for example, an output driver for an LSI tester), and internally [the terminal TVDD] is connected to the sources of PMOS transistors Q6 to Q9. The outputs of the two-input NAND gates G1 to G4 are connected to the gates of the PMOS transistors Q6 to Q9. The drains of the PMOS transistors Q6 to Q9 are the final outputs MS0 to MS3.

As a result of this configuration, when the test operating mode signal TMD="1", one of the PMOS transistors Q6 to Q9 is turned ON in accordance with the values of the decode signals MSI0 and MSI1 so that a current can be supplied to the terminal VI in the signal edge coincidence detection circuit 14 to which the various signal lines are connected via any of the signal lines MS0 to MS3 from the input pin 18 (TVDD shown in FIG. 3).

It is therefore possible to calibrate the clock signal near to the circuit block to be evaluated by observing the current flowing through the pin 18 (TVDD).

In the normal operation mode when the test operating mode signal TMD="0", all the PMOS transistors Q6 to Q9 are turned OFF and no current flows from the input pin 18 (TVDD).

In the signal edge coincidence detection selection circuit 15, the two-input NAND gates G1 to G4 take the place of an AND gate, and the same type of operation is possible even if the PMOS transistors Q6 to Q9 are replaced with NMOS transistors. Generally, in the completely ON state of the PMOS transistors, with the same size (gate width) PMOS transistors and NMOS transistors a larger current flows in the NMOS transistors so that by using NMOS transistors there is a strong possibility of a configuration with a small area.

Figure 1:
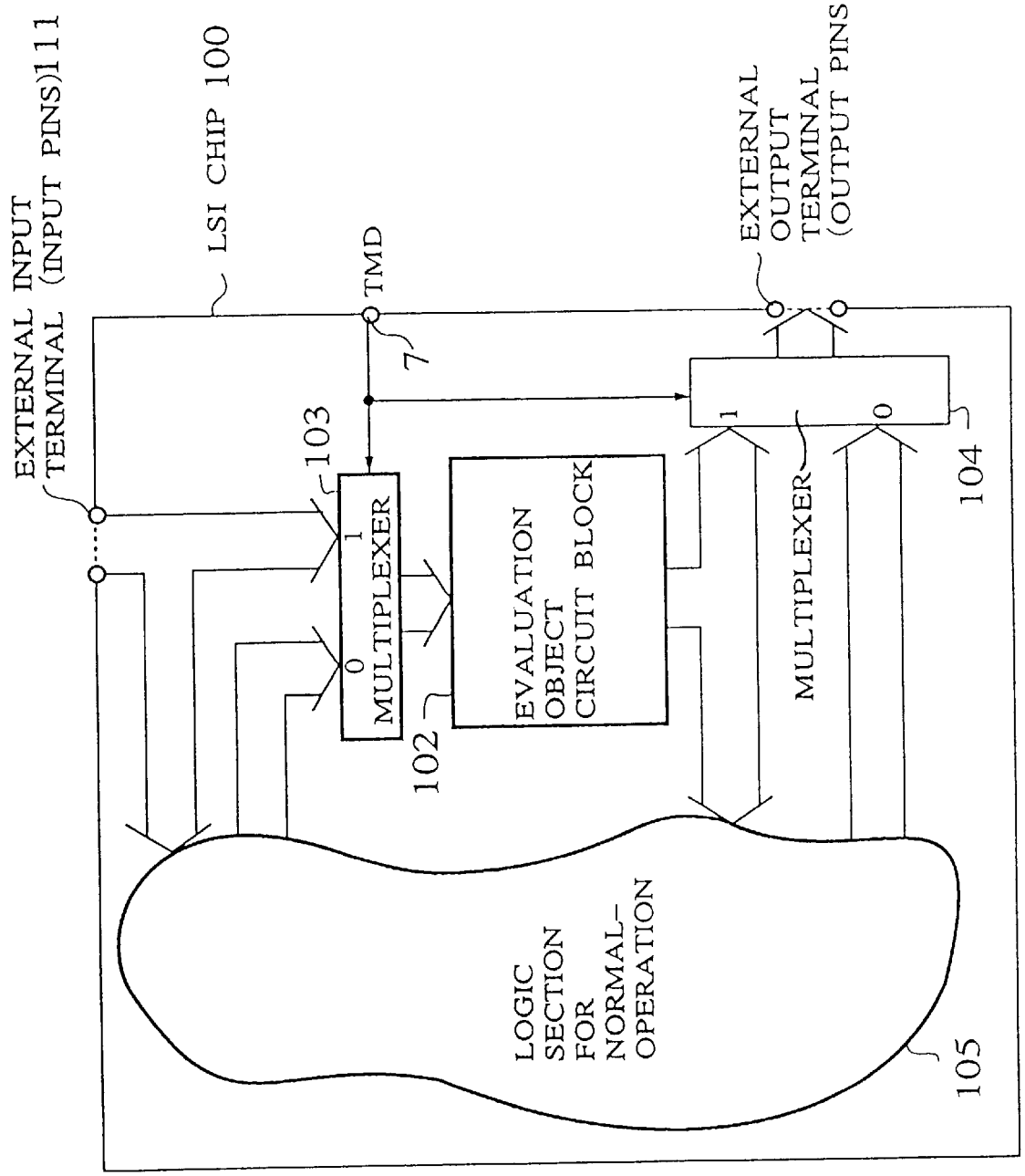
FIG. 1 is a circuit configuration diagram for a first conventional example (method using multiplexers) of a semiconductor integrated circuit.
Figure 5:
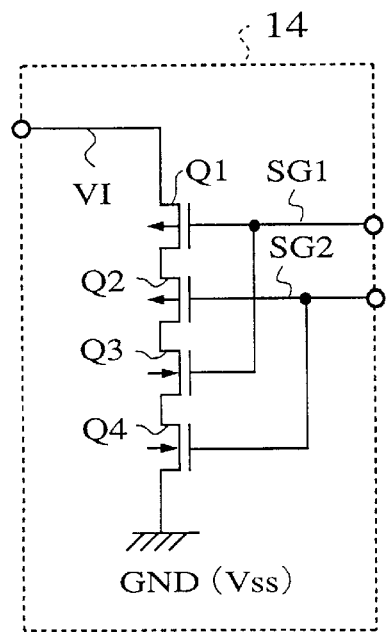
FIG. 5 is a circuit configuration diagram for a signal edge coincidence detection circuit of the first embodiment of the present invention shown in FIG. 3.

FIG. 5 shows the configuration of the signal edge coincidence detection circuit 14. The terminal VI is connected to any of the output signal lines MS0 to MS3 (signal line MS1 in FIG. 1) of the signal edge coincidence detection selection circuit 15 externally (in the LSI chip 1), and is connected to one end of a series connection made up of the two PMOS transistors Q1 and Q2 and the two NMOS transistors Q3 and Q4 on the inside of this circuit.

The other end of the series connection of the PMOS transistors Q1, Q2, and NMOS transistors Q3, Q4 is grounded by connecting to GND ($V_{SS}$).

Each of the edge coincidence-detecting signal lines SG1 and SG2 is connected to a gate of one of the PMOS transistors Q1 or Q2 and to a gate of one of the NMOS transistors Q3 or Q4. (Arrangements of the PMOS transistors and the NMOS transistors other than that shown in FIG. 5 are possible).

Figure 6A:
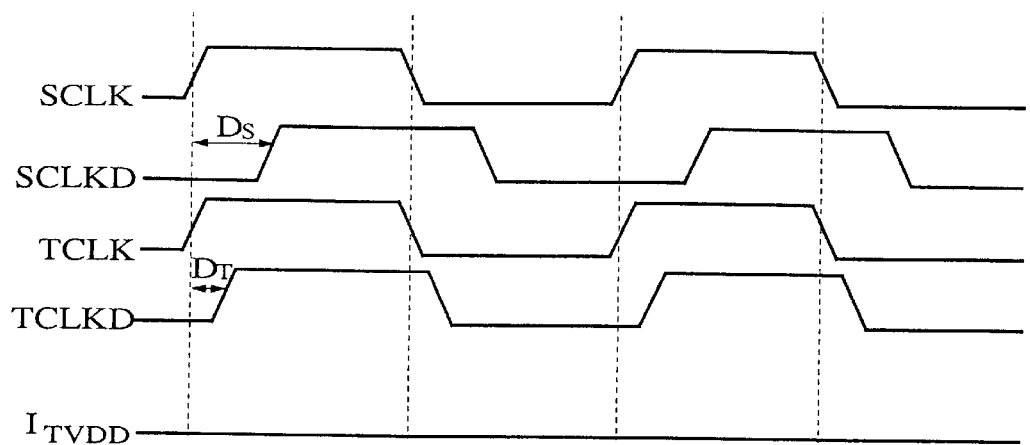
FIGS. 6A to 6C are timing charts for explaining the operation of the first embodiment of the present invention shown in FIG. 3.
Figure 6B:
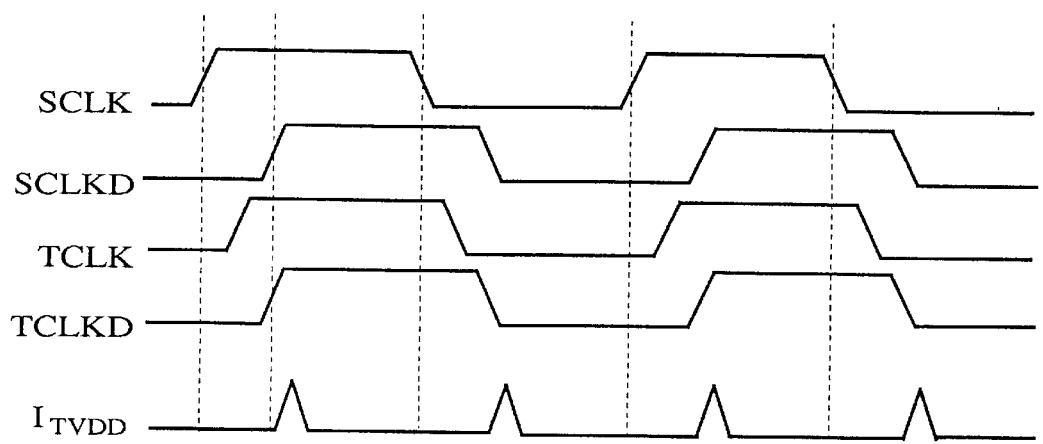
Figure 6C:
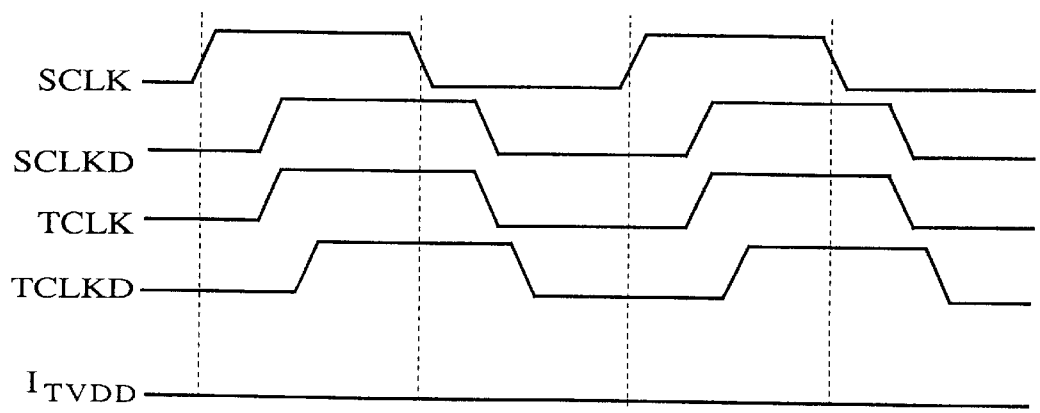

From this configuration, the circuit block 2 as the object of calibration of the clock signal is selected by the signal edge coincidence detection selection circuit 15, and in the state where the test operation mode signal TMD="1", only when the signals SG1 (internal system clock signal SCLKD in FIG. 3) and SG2 (internal test clock signal TCLKD in FIG. 3) are changed simultaneously, the current path from the terminal VI to GND is activated excessively, and the current flows. FIGS. 6A to 6C are timing charts illustrating this state.

FIG. 6A is a timing chart for the case where the internal system clock signal SCLKD and the internal test clock signal TCLKD supplied from outside the LSI chip 1 are applied at the same phase. The duty ratios of internal system clock signal SCLKD and the internal test clock signal TCLKD (ratio of the high state time interval to the low state time interval) are the same (1:1). The delays of the internal clock signals of the LSI chip 1 are different. Generally, the delay DS of the system clock signal SCLKD is greater than the delay DT of the system clock signal TCLKD. This is also illustrated in FIG. 6A. At this time, because the phases of the internal system clock signal SCLKD and the internal test clock signal TCLKD which are to be calibrated are completely offset internally, the current path from the terminal VI to GND is cut, so the current ITVDD does not flow.

In FIG. 6B the phase of the test clock signal TCLK is gradually shifted with respect to the system clock signal SCLK. This drawing illustrates a timing chart for the case where both rising and falling edges of the internal system clock signal SCLKD and the internal test clock signal TCLKD are completely in coincidence. In this case, when these signals change, the current path from the terminal VI to GND is ON excessively, and, as shown in the drawing, the current $I_{TVDD}$ flows in a pulsed state.

FIG. 6C is a timing chart showing the case in which the test clock signal TCLK is even more offset than in the case shown in FIG. 6B. Once again the phases of the internal system clock signal SCLKD and the, internal test clock signal TCLKD are offset, and, in the case shown in FIG. 6A, the current $I_{TVDD}$ does not flow.

In this embodiment of the present invention, even when the signals which are calibrated are offset by ½ cycle, the same type of current is observed, and, if a rough value for the internal signal offset in the LSI chip 1 is estimated by carrying out a simple advance calculation or a simulation, no excessively erroneous assumption is produced, and it is also possible to efficiently execute a signal edge coincidence detection operation in an actual evaluation.

Here, taking a typical CMOS process of 1.0 μm design rule as an example, in the case of FIG. 6B, an estimation under a suitable assumption will be made in the below what degree of current value can be observed.

First, the amount of electric charge corresponding to various current pulses is calculated. Either of clock signals which are the objects of edge coincidence detection, consumes 2 ns ($2 \times 10^{-9}$ sec) for rising from 0 V to 5 V. In the case where the clock signals are in complete coincidence in a edge, ideally, in 2 ns the current goes from "0" to a peak value, and in the next 2 ns once again becomes "0".

In the signal edge coincidence detection circuit 14, when a PMOS transistor with a gate width of 10 μm and an NMOS transistor with a gate width of 5 μm are used, the ON resistances are about 2.5 kΩ and 2.5 kΩ respectively, therefore the peak value of the current is 5 V/(2×2. 5+2×2.5) kΩ=0.50 mA. The current pulse is approximated to be a triangle with this peak value as the high point and a base of 4 ns, therefore the amount of the electric charge is (0.50 mA×4 ns)/2=1.0 pC.

At this time, when operating at a frequency of 20 MHz, the current pulses generate at the rising edges and falling edges of the clock signals, therefore the number of pulses per second is $2 \times 2 \times 10^7$. Accordingly, the current supplied from the pin 18 ($T_{VDD}$) is 1.0 pC×4×10$^7$ 1/sec=40 μA.

In the case where the edges of signals are not in coincidence in FIGS. 6A and 6C, in the circuit of the above-mentioned series connection the direct current path is cut, therefore the current value is almost "0" (about 100 nA at room temperature). For the above difference in the value of current, even the present popular types of LSI testers (for example, logic LSI tester T3340 class made by the Advantest Co. LTD. has adequate resolution so that the difference can be easily measured.

Accordingly, based on the observance of the above type of transient current, the judgement of the coincidence of edges of two clock signals from the timing can be utilized without any problem. However, under low temperature conditions and the like, the input wave form changes sharply, and the timing region in which the current peak can be observed becomes very narrow. There are therefore also cases produced in which a distinct peak cannot be observed, but even the above-mentioned type of tester has a timing resolution normally up to about a minimum of 100 ps (=0.1 ns) so that even if there are changes corresponding to measurement conditions for a width in which the relative timing is changed, it is seen that the above problem is avoided. (However, the time up to edge coincidence detection is lengthened, therefore it is necessary to determine the resolution with due consideration of a trade-off).

A more reliable countermeasure for this problem is to moderately weaken the input signal to be calibrated so that, even when the peak of current is the sharpest, it is not necessary that the timing measurement resolution on the LSI tester side is particularly reduced, by implementing some circuit on the LSI chip 1.

In the easiest way for moderating a change speed of the signal there is a method of using a polycrystalline silicon for the wiring 12L, 13L. The sheet resistivity of this wire is 50 to 100 Ω/□, therefore for wiring of 0.1 to 0.2 mm it is easy to obtain a resistance value of about R=10 kΩ. At this time, it is possible for a surplus of about 10kΩ×0.1 pF=1 ns to be produced by means of a so-called RC delay if the capacitance C is about 0.1 pF.

Also, it is possible to generate the above-mentioned delay using a following special circuit. For example, the positioning of a transmission gate between the terminals SG1 and SG2 and the gate inputs of the series connection of the MOS transistors Q1 to Q4, or adding a load capacity which is formed by the MOS transistor, can be considered. Such a method is required in a case where signals to be calibrated be adjacent to each other and the length of the wiring from the inverters 12 and 13 for sampling to the signal edge coincidence detection circuit 14 cannot be too long.

In addition, a device by which the current more easily flows can be provided by means of a circuit configuration which differs from the special circuit described above (a few embodiments will be described later) and is contained in the scope of the present invention. In addition, it is possible to adopt a configuration whereby the PMOS transistors Q6 to Q9 of the signal edge coincidence detection selection circuit 15 are connected to the power source side of the series connection of the signal edge coincidence detection circuit 14. In this case, a decode signal for selecting the circuit block for evaluation of the AC operation performance must be positioned inside the LSI chip, and the wiring region is increased in comparison with the present embodiment.

Various modification of the signal edge coincidence detection circuit 14 are shown in FIGS. 7A to 7D and FIGS. 8A to 8B.

Figure 7A:
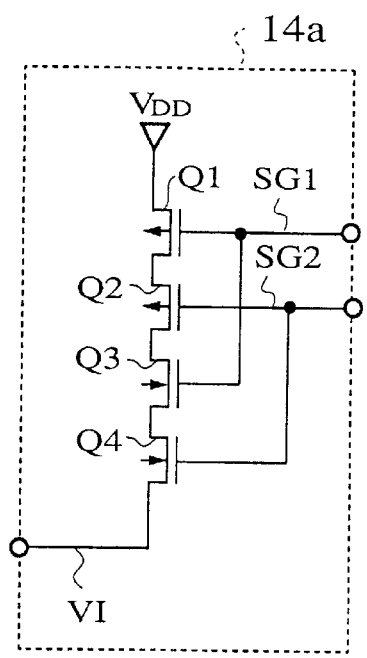
FIGS. 7A to 7D are circuit configuration diagrams for the signal edge coincidence detection circuit of a modification of the first embodiment of the present invention shown in FIG. 5.
Figure 7B:
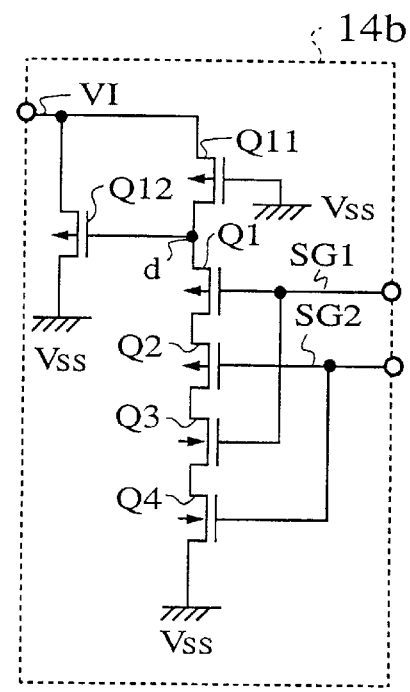

In a signal edge coincidence detection circuit 14a(first modification) shown in FIG. 7A, the end of the serial connection by the PMOS transistors Q1 and Q2 and the NMOS transistors Q3 and Q4, grounded, in the signal edge coincidence detection circuit 14 shown in FIG. 5, is connected to the terminal VI, and the other end, connected to the terminal VI in FIG. 5, is connected to the power source $V_{DD}$ of the LSI chip 1. With this configuration, a lower potential (normally $V_{SS}$) than the potential $V_{DD}$ from the external current supply source of the LSI tester and the like, is provided at the pin 18 of the LSI chip 1 in FIG. 3.

In the case where two signals of a certain circuit block are calibrated by the signal edge coincidence detection circuit 14a, the terminal VI should be externally conductive state via the pin 18 and the signal edge coincidence detection selection circuit 15.

In the case where the changed timing of the two terminals SG1 and SG2 is not in coincidence, current does not flow between the power source $V_{DD}$ and the terminal VI, normally in the OFF state, but in the state where these are in coincidence, an transient current flows between the power source $V_{DD}$ and the terminal VI.

From outside the LSI chip 1 it is observed that an transient current flows out from the pin 18 (terminal $T_{VDD}$). In a signal edge coincidence detection circuit 14b(second modification) shown in FIG. 7B, one end of the series connected circuit by the PMOS transistors Q1 and Q2 and the NMOS transistors Q3 and Q4 is grounded ($V_{SS}$), and the other end is connected to the drain of the PMOS transistors Q11 and to the gate of the PMOS transistor Q12; the gate of the PMOS transistor Q11 is connected to the earth; the drain of the PMOS transistor Q12 is connected to the earth; and the sources of the PMOS transistors Q11 and Q12 are used as the terminal VI which are connected to any one of the output signal lines MS0 to MS3 of the signal edge coincidence detection selection circuit 15.

In this modification, the PMOS transistor Q11 is used as a resistance, and when the transient current flows to the series connection circuit the potential of a node d drops so that the PMOS transistor Q12 is in the ON state.

Accordingly, although the transient current flowing in a path from the node d to ground ($V_{SS}$) is reduced, the PMOS transistor Q12 is single, there are cases where more transient current flows in the path from the terminal VI through the PMOS transistor Q12 to $V_{SS}$. Also, it is possible to substitute the PMOS transistor Q11 an NMOS transistor whose gate is connected to the power source $V_{DD}$. Furthermore, the same effect is obtained when a single resistance is utilized instead of this transistor.

Figure 7C:
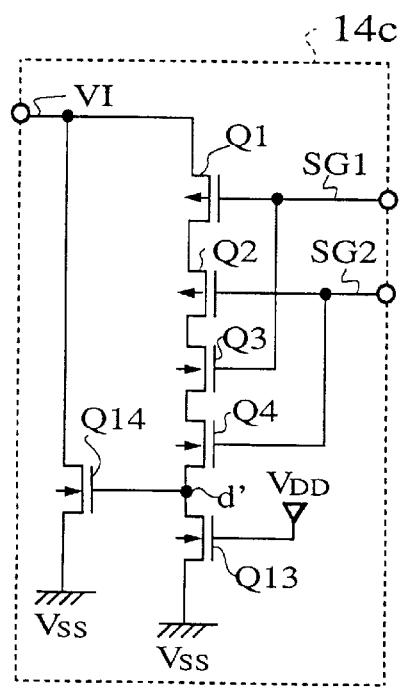

In a signal edge coincidence detection circuit 14c (third modification) shown in FIG. 7C, one end of a series connected circuit made up of the PMOS transistors Q1 and Q2 and the NMOS transistors Q3 and Q4, is taken as the terminal VI and is connected to any of the output signal lines MS0 to MS3 of the signal edge coincidence detection selection circuit 15. The other end is connected to the drain of the NMOS transistor Q13 and to the gate of the NMOS transistor Q14. The gate of the NMOS transistor Q13 is connected to the power source $V_{DD}$, and the drain of the NMOS transistor Q14 is connected to the terminal VI, while the sources of the NMOS transistors Q13 and Q14 the ground ($V_{SS}$).

In this modification, as in the second modification, the NMOS transistor Q13 is used as a resistance, and more transient current flows. Also, it is possible to by substitute the NMOS transistor Q13 to a PMOS transistor whose gate is connected to ground. The same effect is obtained when a single resistance is utilized instead of this transistor.

Figure 7D:
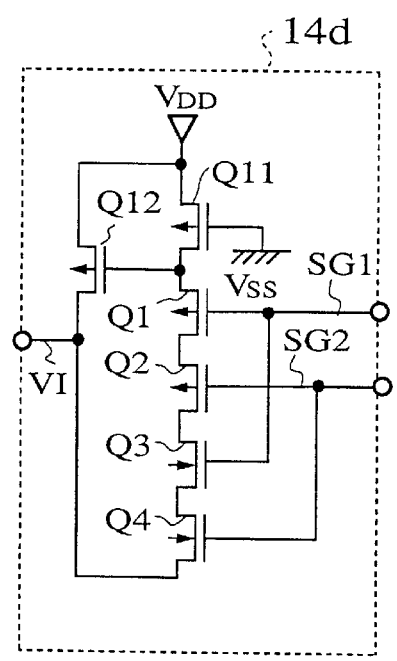

In a signal edge coincidence detection circuit 14d (fourth modification) shown in FIG. 7D, compared with the second modification shown in FIG. 7A, one end of the series connection made up of the PMOS transistors Q1 and Q2 and the NMOS transistors Q3 and Q4, as well as the grounded drain of the PMOS transistor Q12, are connected to the terminal VI, and the sources of the PMOS transistors Q11 and Q12 are connected to the power source $V_{DD}$.

In the test operation mode (TMD="1"), the coincidence detection of the edges of the signals SG1 and SG2 can be performed in the same manner as for the second modification. In this fourth modification, as in the case of the second modification, it is possible for the PMOS transistors to be replaced by NMOS transistors and the gates to be connected to the power source $V_{DD}$, and for the transistor to be replaced by a single resistance. The configuration is also possible wherein only the drain of the PMOS transistor Q12 is connected to the terminal VI and one end of the series connection connected to the terminal VI is grounded. No particular explanation will be given, but also in the third modification shown in FIG. 7C, another configuration of an edge coincidence detection circuit is possible by adding the same alterations obtained from the second modification to the fourth modification.

In addition, in the above-explained embodiment and its first to fourth modifications, the signal edge coincidence detection circuit has the configuration whereby, when the two signals to be calibrated—the internal system clock signal SCLKD (SG1) and the internal test clock signal TCLKD (SG2)—are changed simultaneously, an transient current flows in a third signal line MS1 (terminal VI), and a configuration can also be considered whereby the voltage in the third signal line MS1 (terminal VI) is changed when these two signals are changed simultaneously.

The examples of the detection of edge coincidence of two objective signals by the change in voltage will now be given.

Figure 8A:
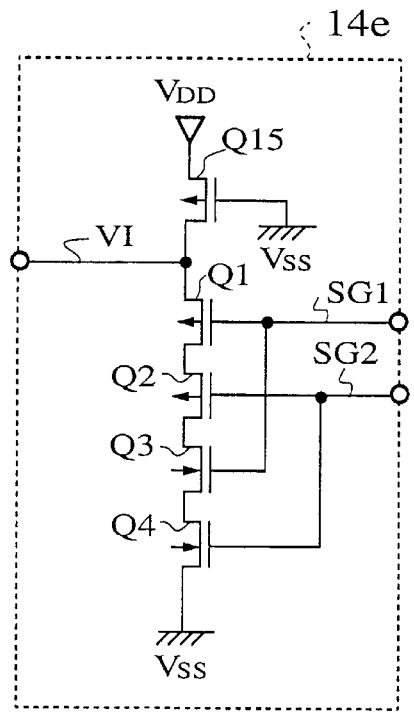
FIG. 8A is a circuit configuration diagram for a signal edge coincidence detection circuit of another modification of the first embodiment of the present invention shown in FIG. 5.

A signal edge coincidence detection circuit 14e (fifth modification) shown in FIG. 8A is formed from a circuit wherein the PMOS transistors Q1 and Q2 and the NMOS transistors Q3 and Q4 are connected in series with the PMOS transistor Q15 of which the gate is grounded, One end of the above serial connection of transistors is grounded ($V_{SS}$), and the point where the drain of the PMOS transistor Q15 and the source of the PMOS transistor Q1 are connected is taken as the terminal VI, and is connected to any one of the output signal lines MS0 to MS3 of the signal edge coincidence detection selection circuit 15.

Figure 8B:
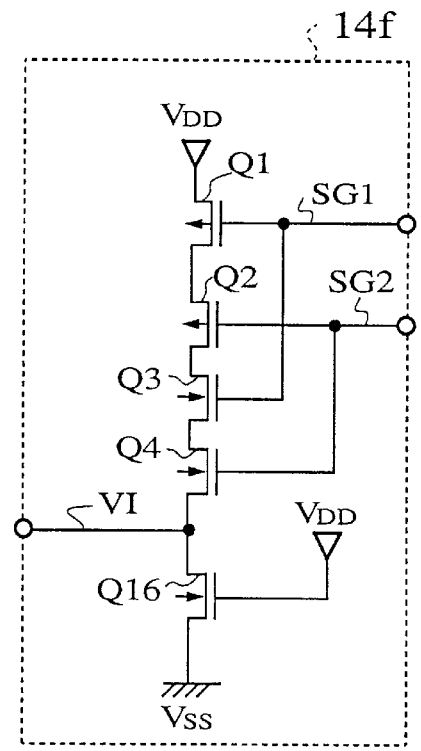
FIG. 8B is a circuit configuration diagram for a signal edge coincidence detection circuit of yet another modification of the first embodiment of the present invention.
Figure 8C:
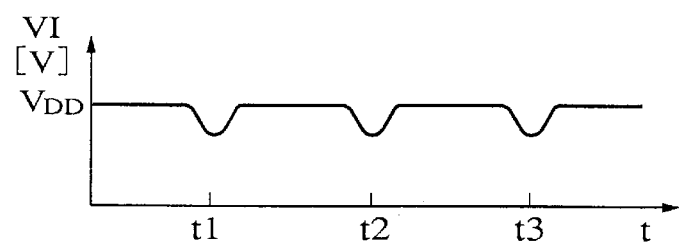
FIG. 8C is a timing chart for explaining the voltage changes of the signal in the circuit shown in FIG. 8A.

In this modification, as shown in FIG. 8C, when the two signals—the internal system clock signal SCLKD (SG1) and the internal test clock signal TCLKD (SG2)—are changed simultaneously, the potential of the terminal VI ($TV_{DD}$) changes pulse-wise with respect to the power source $V_{DD}$. Therefore, by observing this change using an LSI tester or a sampling oscilloscope it is possible to detect coincidence of edges of the internal system clock signal SCLKD and the internal test clock signal TCLKD. It is possible to replace the PMOS transistor Q15 with an NMOS transistor, the gate of which is connected to the power source $V_{DD}$. Also, this transistor can be replaced by a single resistance. A signal edge coincidence detection circuit 14f (sixth modification) shown in FIG. 8B is formed from a circuit wherein the PMOS transistors Q1 and Q2 and the NMOS transistors Q3 and Q4 are connected in series with the NMOS transistor Q16 of which the gate is connected to the power-source $V_{DD}$. One end is connected to the power source $V_{DD}$, and the point where the drain of the NMOS transistor Q16 and the source of the NMOS transistor Q4 are connected is taken as the terminal VI, and is connected to any one of the output signal lines MS0 to MS3 of the signal edge coincidence detection selection circuit 15.

Figure 8D:
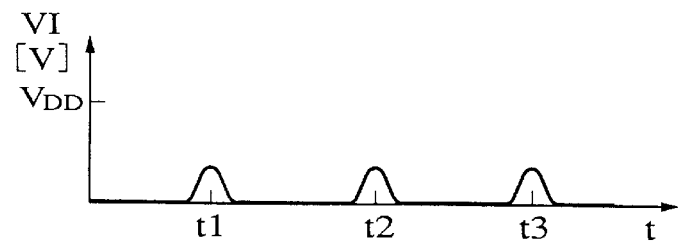
FIG. 8D is a timing chart for explaining the voltage changes of the signal in the circuit shown in FIG. 8C.

In this modification, as shown in FIG. 8D, in the same manner as the fifth modification, when the two signals—the internal system clock signal SCLKD (SG1) and the internal test clock signal TCLKD (SG2)—are changed simultaneously, the voltage change of the terminal VI ($TV_{DD}$) is observed and the edge coincidence of these two signals can be detected. In addition, it is possible to replace the NMOS transistor Q16 with a PMOS transistor whose gate is grounded. Also, this transistor can be replaced by a single resistance.

Figure 9:
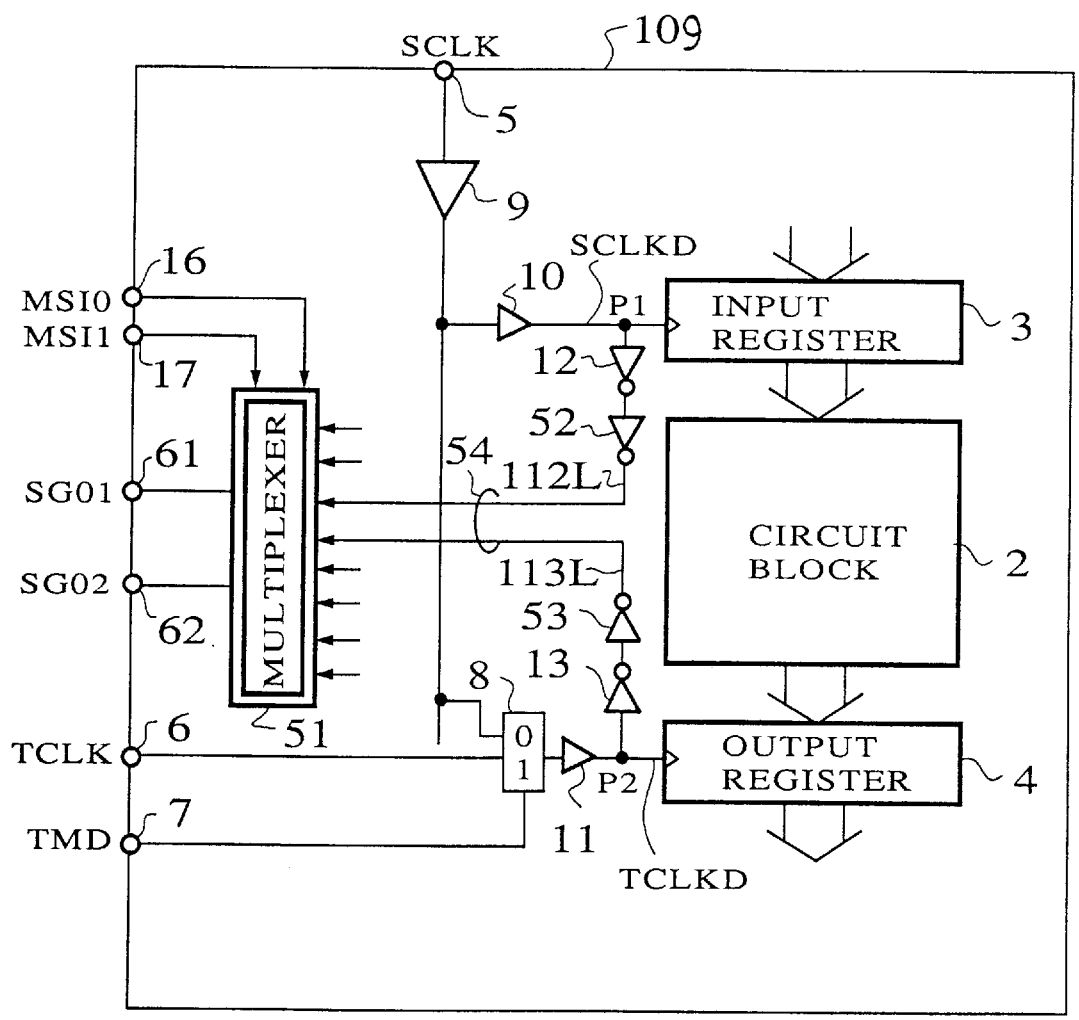
FIG. 9 is a circuit configuration diagram for a second embodiment (calibration by method using signal paths with equal delays) of a semiconductor integrated circuit of the present invention.

FIG. 9 is a circuit configuration diagram for a second embodiment of a semiconductor integrated circuit of the present invention.

In this embodiment of a semiconductor integrated circuit, the conditions in the first embodiment assigned to the data path from the circuit for sampling the signals to be calibrated (the inverters 12 and 13) up to the signal edge coincidence detection circuit 14, are also extended so as to be applied to the data path up to the output pin of an LSI chip 109.

Specifically, by making it possible to observe, from outside an LSI chip 109, a clock signal which is supplied to the input register 3 and the output register 4 of the circuit block 2 which is the object of the AC operation performance via a data path which has exactly the same delay characteristics, the phase difference of a signal line adjacent to the circuit block which is the object of the AC operation performance can be observed as is from outside the LSI chip 109 by accurately routing the wiring.

As for the circuit block 2, the delay from the sampling point P1 of the internal system clock signal SCLKD to the tip of the wiring 112L, through the inverter 12 and the inverter buffer 52 for signal drive, and the delay from the sampling point P2 of the internal system clock signal TCLKD to the tip of the wiring 113L, through the inverter 13 and the inverter buffer 53 for signal drive, are made precisely the same, for example, by giving a configuration with exactly the same size (gate width) and length (load and resistance).

Further, the tip of the wiring 112L and the tip of the wiring 113L are connected to a multiplexer 51, shown double-framed, through a wiring pair 54 (a difference in length of the wiring 112L and the wiring 113L can be ignored in comparison with the length of the wiring 112L, 113L). The multiplexer 51 is for outputting a wiring pair for observing a clock signal from each circuit block at the same delay to the output pins SGO1 and SGO2.

In this manner, the phase difference of a signal line adjacent to the circuit block 2 to be evaluated for AC operation performance can be observed from outside the LSI chip 109. However, in this embodiment, an electrical signal is propagated to the exterior of the LSI chip 109, therefore a buffer having a relatively strong driving power (in the drawing, inverter buffers 52 and 53 for signal drive) is required. In addition, because it is necessary to route the wiring 54 in two parallel lines, the overhead is also large for the layout, and in the case where many circuit blocks exist inside the LSI chip 109 for evaluation of AC performance, the overhead for implementation is rather large, so that, in the case where a particularly large number of circuit blocks (more than 10) does not exist inside the LSI chip 109 for evaluation of AC performance, this is judged to be a suitable method.

As can be clearly understand from the foregoing explanation of the first and second embodiments shown in FIGS. 3 and 9, the present invention is not restricted to only the calibration of clock signals but can be applied normally to signals to be calibrated inside the LSIs 1 or 100. Here, because the first embodiment is based on the observation of transient current as a result of the coincidence of edges of the signals, it is necessary that the signals to be calibrated be changed with a certain degree of frequency. The second embodiment is based on direct observation therefore it can be applied at all times. With respect to the first and second embodiments, the polarity of the signals and the change of the configuration of the details of the circuits obtained are completely included in the scope of the present invention.

What is claimed is:

1. A semiconductor integrated circuit, comprising:
a plurality of signal edge coincidence detecting means each receiving a respective first signal and a respective second signal which are generated within said semiconductor integrated circuit, each said signal edge detecting means outputting a respective transient current only when said first signals and said second signals change simultaneously, wherein the transient currents of the plurality of signal edge detecting means are not directly supplied to an external terminal of the semiconductor integrated circuit; and
selection means for inputting the transient currents and for selecting one of the transient currents for output to the external terminal of the semiconductor integrated circuit.

2. A semiconductor integrated circuit comprising:
a circuit block to be evaluated in AC performance in accordance with first and second signal generated within said integrated circuit; and
a signal edge coincidence detecting means for receiving said first and second signals, said signal edge coincidence detecting means outputting a transient current only when said first signal and said second signal change simultaneously;
wherein said transient current is output through an external terminal of said semiconductor integrated circuit for evaluating the AC performance of said circuit block by observing said transient current and calibrating edge detection of said first and second signals.

3. The semiconductor integrated circuit as claimed in claim 2, wherein the signal edge coincidence detecting means comprises a series circuit including a first PMOS transistor, a second PMOS transistor, a first NMOS transistor, and a second NMOS transistor wherein
the source of the second NMOS transistor, corresponding to one end of the series circuits, is grounded,
the source of the first PMOS transistor, corresponding to the other end of the series circuit, is connected to said external terminal of the semiconductor integrated circuit,
the first signal is input to the gate of one of the first and second PMOS transistors and to the gate of one of the first and second NMOS transistors; and
the second signal is input to the gate of the other of the first and second PMOS transistors and to the gate of the other of the first and second NMOS transistors.

4. The semiconductor integrated circuit as claimed in claim 3, wherein, in the signal edge coincidence detection means, the source of the second NMOS transistor is connected to said external terminal of the semiconductor integrated circuit, and the source of the first PMOS transistor is connected to a power source.

5. A semiconductor integrated circuit as claimed in claim 3, wherein the signal edge coincidence detecting means includes a circuit element which functions as a resistance, and one end of the circuit element is connected to said external terminal of the semiconductor integrated circuit;
said external terminal is connected to the source of a third PMOS transistor of which the drain is grounded;
the other end of the circuit element is connected to said other end of the series circuit which is the source of said first PMOS transistor and to the gate of said third PMOS transistor.

6. The semiconductor integrated circuit as claimed in claim 5, wherein, in the signal edge coincidence detecting means, the external terminal of the semiconductor integrated circuit is connected only to the drain of the additional PMOS transistor, and the source of the additional PMOS transistor is connected to the power source.

7. The semiconductor integrated circuit as claimed in claim 3, wherein the signal edge coincidence detecting means includes a circuit element which functions as a resistance, and one end of the circuit element is grounded;
said external terminal of the semiconductor integrated circuit is connected to both the drain of a third NMOS transistor, of which the source is grounded, and to the first PMOS transistor corresponding to the other end of the series circuit;
the other end of the circuit element is connected to both the other end of the series circuit which is the source of said second NMOS transistor and to the gate of said third NMOS transistor.

8. The semiconductor integrated circuit as claimed in claim 7, wherein, in the signal edge coincidence detecting means, the external terminal of the semiconductor integrated circuit is connected to one of the source of said additional NMOS transistor and the circuit element; and the drain of said additional NMOS transistor, and the end of the series circuit which is the source of said one of the PMOS transistors corresponding to the other end of the series circuit which is connected to a power source.

9. The semiconductor integrated circuit as claimed in claim 2 or claim 1 wherein circuit elements, located in a first path from a sampling point of the first signal, and circuit elements, located in a second path from a sampling point of the second signal to respective input points of the signal edge coincidence detecting means and the signal generating circuit are identical.

10. The semiconductor integrated circuit as claimed in claim 9, wherein the circuit elements located in the first path and the second path comprise:

first and second sampling means for sampling the first signal and the second signal, respectively; and first and second wirings from the first and second sampling means to the input points of the signal edge coincidence detecting means or signal generating circuit, wherein the first and second sampling means have identical signal drivability; and the first and second wiring have identical load capacitance and resistance values.

11. A semiconductor integrated circuit comprising:

a circuit block to be evaluated in AC performance in accordance with first and second signals generated within said integrated circuit; and a signal generating circuit for receiving said first signal and said second signal and outputting a third signal only when said first signal and said second signal change simultaneously;

wherein said third signal is output through an external terminal of said semiconductor integrated circuit for evaluating the AC performance of said circuit block by observing said third signal and calibrating edge detection of said first and second signals.

12. The semiconductor integrated circuit as claimed in claim 11, wherein the signal generating circuit comprises a series circuit in which a first PMOS transistor, a second PMOS transistor, a first NMOS transistor, and a second NMOS transistor are connected in series, and a third PMOS transistor, of which the gate is grounded, is connected in series with said series circuit, the end of the series circuit, which is the source of second NMOS transistor, is grounded;

the source of the third PMOS transistor of which the gate is grounded is connected to a power source;

said external terminal of the semiconductor integrated circuit is connected to the point connecting the drain of the third PMOS transistor to the other end of the series circuit which is the source of said first PMOS transistors;

the first signal is input to the gate of one of the first or second PMOS transistors and to the gate of one of the first or second NMOS transistor of the series circuit; and the second signal is input to the gate of the other PMOS transistor and to the gate of the other NMOS transistor of the series circuit.

13. The semiconductor integrated circuit as claimed in claim 11, wherein the signal generating circuit comprises a series circuit including a first PMOS transistor, a second PMOS transistor, a first NMOS transistor, a second NMOS transistor, and a third NMOS transistor, of which the source is grounded, connected in series with said series circuit, the gate of the third NMOS transistor is connected to a power source, said external terminal of the semiconductor integrated circuit is connected to the point connecting the drain of the third NMOS transistor and to one end of the series circuit which is the source of the second NMOS transistor.

14. A semiconductor integrated circuit comprising:

a circuit block to be evaluated in AC performance in accordance with a first and second signal generated within said integrated circuit; and an output circuit receiving said first signal and said second signal and outputting said first and second signals via first and second data paths, respectively, which have an equal propagation delay characteristic, for evaluating the AC performance of said circuit block by calibrating edge detection of said first and second signals.

15. A semiconductor integrated circuit comprising:

a circuit block to be evaluated in AC performance;

a plurality of output circuits, each receiving a first signal and a second signal which are generated within said semiconductor integrated circuit, said each of said plurality of output circuits outputting said first and second signals via first and second data paths, respectively, which have an equal propagation delay characteristic for evaluating the AC performance of said circuit block by calibrating edge detection of said first and second signals; and selecting means for selecting said first signal and said second signal from the first and second data paths outputted by one of said plurality of output circuits.

16. The semiconductor integrated circuit as claimed in claim 15, wherein said each of the plurality of output circuits comprises:

first and second sampling means for sampling the first signal and the second signal, respectively;

first and second drive means for driving outputs of the first and second sampling means; and first and second wirings from the first and second drive means to an external terminal of one of the semiconductor integrated circuit and the selection means, respectively, wherein the first and second sampling means and the first and second drive means have the same drivability, and the first and second wirings have the same load capacitance and resistance values.

17. A semiconductor integrated circuit, comprising:

a plurality of signal generating circuits each receiving a respective first signal and a respective second signal which are generated within said semiconductor integrated circuit, each said signal generating circuit respectively outputting a third signal only when said respective first and second signals change simultaneously, wherein the third signals of the signal generating circuits are not directly supplied to an external terminal of the semiconductor integrated circuit; and selection means for inputting the third signals of the signal generating circuits and for selecting one of the third signals for output to said external terminal of the semiconductor integrated circuit.

* * * * *